United States Patent
Babich et al.

(10) Patent No.: US 6,815,329 B2
(45) Date of Patent: Nov. 9, 2004

(54) MULTILAYER INTERCONNECT STRUCTURE CONTAINING AIR GAPS AND METHOD FOR MAKING

(75) Inventors: Katherina E. Babich, Chappaqua, NY (US); Roy Arthur Carruthers, Stormville, NY (US); Timothy Joseph Dalton, Ridgefield, CT (US); Alfred Grill, White Plains, NY (US); Jeffrey Curtis Hedrick, Montvale, NJ (US); Christopher Vincent Jahnes, Upper Saddle River, NJ (US); Ebony Lynn Mays, Atlanta, GA (US); Laurent Perraud, Paris (FR); Sampath Purushothaman, Yorktown Heights, NY (US); Katherine Lynn Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 10/117,797

(22) Filed: Apr. 2, 2002

(65) Prior Publication Data

US 2002/0158337 A1 Oct. 31, 2002

Related U.S. Application Data

(62) Division of application No. 09/500,292, filed on Feb. 8, 2000, now abandoned.

(51) Int. Cl.$^7$ ............................................. H01L 21/4763
(52) U.S. Cl. .................. 438/619; 438/618; 438/622; 438/624; 438/633; 438/639
(58) Field of Search ................................ 438/618, 619, 438/622–629, 631, 633, 634, 637, 639

(56) References Cited

U.S. PATENT DOCUMENTS

| | | | | |
|---|---|---|---|---|
| 5,798,559 A | * | 8/1998 | Bothra et al. | 257/522 |
| 5,998,293 A | * | 12/1999 | Dawson et al. | 438/619 |
| 6,054,379 A | * | 4/2000 | Yau et al. | 438/623 |
| 6,064,118 A | * | 5/2000 | Sasaki | 257/758 |
| 6,100,184 A | * | 8/2000 | Zhao et al. | 438/638 |
| 6,140,226 A | * | 10/2000 | Grill et al. | 438/637 |
| 6,218,282 B1 | * | 4/2001 | Buynoski | 438/619 |
| 6,495,445 B2 | * | 12/2002 | Clevenger et al. | 438/619 |
| 6,514,878 B2 | * | 2/2003 | Watatani | 438/769 |

\* cited by examiner

*Primary Examiner*—Tom Thomas
*Assistant Examiner*—N. Drew Richards
(74) *Attorney, Agent, or Firm*—Scully, Scott, Murphy & Presser; Robert M. Trepp

(57) ABSTRACT

A novel air-gap-containing interconnect wiring structure is described incorporating a solid low-k dielectric in the via levels, and a composite solid plus air-gap dielectric in the wiring levels. Also provided is a method for forming such an interconnect structure. The method is readily scalable to interconnect structures containing multiple wiring levels, and is compatible with Dual Damascene Back End of the Line (BEOL) processing.

13 Claims, 8 Drawing Sheets

MULTILAYER INTERCONNECT STRUCTURE CONTAINING AIR GAPS AND METHOD FOR MAKING

This is a division of application Ser. No. 09/500,292, filed Feb. 8, 2000 abn.

CROSS REFERENCE TO A RELATED APPLICATION

Cross reference is made to U.S. Ser. No. 09/374,839 filed Aug. 14, 1999 by L. Clevenger and L. Hsu (YO999-146) entitled "Semi Sacrificial Diamond for Air Dielectric Formation" which is directed to multilevel interconnect structures on integrated circuit chips incorporating in at least one multilevel a gaseous dielectric medium confined within the chip by a dielectric encapsulant.

1. Field of the Invention

The present invention relates to air-gap-containing metal/insulator interconnect structures for Very Large Scale Integrated (VLSI) and Ultra Large Scale Integrated (ULSI) semiconductor devices and packaging, and more particularly to structures, methods, and materials relating to the incorporation of voids, cavities or air gaps into multiple levels of multilayer interconnect structures for reducing wiring capacitance.

2. Background of the Invention

Device interconnections in Very Large Scale Integrated (VLSI) or Ultra-Large Scale Integrated (ULSI) semiconductor chips incorporate multilevel interconnect wiring structures containing patterns of metal wiring layers called traces. Wiring structures within a given trace or level of wiring are separated by an intralevel dielectric, while the individual wiring levels are separated from each other by layers of an interlevel dielectric. Conductive vias are formed in the interlevel dielectric to provide interlevel contacts between the wiring traces.

By means of their effects on signal propagation delays, the materials and layout of these interconnect structures can substantially impact chip speed, and thus chip performance. Signal propagation delays are due to RC time constants wherein R is the resistance of the on-chip wiring, and C is the effective capacitance between the signal lines and the surrounding conductors in the multilevel interconnection stack. RC time constants are reduced by lowering the specific resistance of the wiring material, and by using interlevel and intralevel dielectrics (ILDs) with lower dielectric constants k.

A preferred metal/dielectric combination for low RC interconnect structures may be Cu metal with a dielectric such as $SiO_2$ (k~4.0). Due to difficulties in subtractively patterning copper, copper-containing interconnect structures are typically fabricated by a Damascene process. In a Damascene process, metal patterns inset in a layer of dielectric are formed by the steps of 1) etching holes (for vias) or trenches (for wiring) into the interlevel or intralevel dielectric, 2) lining the holes or trenches with one or more adhesion or diffusion barrier layers, 3) overfilling the holes or trenches with a metal wiring material, and 4) removing the metal overfill by a planarizing process such as chemical mechanical polishing (CMP), leaving the metal even or coplanar with the upper surface of the dielectric. The above process may be repeated until the desired number of wiring and via levels have been fabricated.

Fabrication of interconnect structures by Damascene processing can be substantially simplified by using a process variation known as Dual Damascene, in which patterned cavities for the wiring level and its underlying via level are filled in with metal in the same deposition step. This reduces the number of metal polishing steps by a factor of two, at substantial cost savings, but requires that a dual-relief pattern be introduced into the combined via and wiring level dielectric.

Low-k alternatives to the dielectric $SiO_2$ include carbon-based solid materials such as diamond-like carbon (DLC), also known as amorphous hydrogenated carbon (a-C:H), fluorinated DLC (FDLC), SiCO or SiCOH compounds, and organic or inorganic polymer dielectrics. Nanoporous versions of $SiO_2$ and these carbon-based materials have even lower k values, while air gaps have the lowest values of any material where k~1.00. The gas in the air gap may comprise air, any gaseous material of vacuum.

Examples of multilayer interconnect structures incorporating air gaps are described in U.S. Pat. No. 5,461,003, by R. H. Havemann and S-P Jeng; U.S. Pat. No. 5,869,880, by A. Grill and K. L. Saenger, and U.S. Pat. No. 5,559,055, by M. S. Chang and R. W. Cheung.

Air gaps can be formed by one of two basic methods. In the first method, described previously by J. G. Fleming et al. in Advanced Metallization and Interconnect Systems for ULSI Applications in 1996 p. 471-7 (1997) and shown in FIGS. 1A–1C herein, the air gap is formed in a structure comprising a cavity 10 between conductive features 20 on substrate 30 as shown in FIG. 1A. Air gaps or keyholes 40 are formed when cavity 10 is partially filled with a poorly conformal layer of dielectric 50 as shown in FIG. 1B. Poorly conformal dielectric 50 may be deposited by a process such as plasma-enhanced chemical vapor deposition (PECVD). FIG. 1C shows the structure of FIG. 1B after planarization by a process such as chemical mechanical polishing.

A second method for forming air gaps utilizes a sacrificial material which is removed after formation of a bridge layer, as illustrated in FIGS. 2A–2C herein and previously described in P. A. Kohl et al., Electrochemical and Solid-State Letters 1 49 (1998). FIG. 2A shows a planar structure comprising substrate 30, conductive features 20, and sacrificial material 60. The structure of FIG. 2A is then capped with a "bridge" layer 70 shown in FIG. 2B, followed by removal of sacrificial material 60 to leave air gap 80 as shown in FIG. 2C. Examples of sacrificial materials and removal methods include poly (methy methacrylate) (PMMA) and parylene (e.g., poly-para-xylylene sold under the trademark "Paralylene")which may be removed by organic solvents, oxygen ashing, and/or low temperature (~200° C.) oxidation, and norborene-based materials such as BF Goodrich's Unity Sacrificial Polymers™, which may be removed by low temperature (350–400° C.) thermal decomposition into volatiles. In the case of Unity™, the volatiles actually diffuse through the bridge layer. Diffusion through a bridge layer was demonstrated by Kohl et al. for structures comprising $SiO_2$ (500 nm) bridge layers deposited by low temperature PECVD.

Compared to solid dielectrics, air gap dielectrics have lower thermal conductivity, near-zero mechanical strength, and higher permeability to moisture and oxygen. Workable schemes for incorporating air gaps into interconnect structures must take these limitations into account. A particular concern with air gap dielectrics is that they leave metal wiring features more susceptible to the opens and shorts induced by electromigration-driven mass transport, since the wiring features are no longer dimensionally constrained by a solid dielectric in which they are embedded. Another concern is that structures with air gaps may not be as uniformly planar as structures built with intrinsically more rigid solid dielectrics. This can be a problem if locally depressed areas are formed by bridge layer sag over unsupported air gaps, since metal over or filling these areas will remain in the structure after CMP and be a source of shorts and/or extra capacitance.

It is thus an object of this invention to provide a multilayer interconnect structure containing air gaps.

It is a more specific object of this invention to provide a stable, high performance multilayer interconnect structure containing air gaps in the plane of one or more buried wiring levels to reduce wiring capacitance.

It is a further object of this invention to provide an air-gap-containing interconnect structure which is resistant to electromigration failure and environmental corrosion.

It is an additional object of this invention to provide a method for forming multilayer interconnect structures containing voids, cavities or air gaps in the plane of one of more buried wiring levels, using Dual Damascene processing and an air gap defined initially by a solid sacrificial material which is subsequently removed by thermal decomposition to form a gas which is out-diffused or released through openings or removed by plasma, $O_2$ microwave radiation or by radiant energy such as by ultra violet light or by a laser at a selected wavelength.

SUMMARY OF THE INVENTION

The present invention provides a novel void, cavity or air-gap-containing interconnect structure which uses a solid low-k dielectric in the via levels, and a composite solid and void, cavity or air-gap dielectric for the wiring levels. The structure is readily scalable to multiple levels and is compatible with Dual Damascene processing. The solid low-k dielectric in the via levels in an alternative embodiment may be porous and/or contain voids, cavities or air-gaps.

BRIEF DESCRIPTION OF THE DRAWING

These and other features, objects, and advantages of the present invention will become apparent upon a consideration of the following detailed description of the invention when read in conjunction with the drawing, in which:

FIGS. 6A–6L show a cross section view illustrating progressive steps of a method for forming a structure of the present invention.

DESCRIPTION OF THE PREFERRED EMBODIMENTS

Figure 1A:
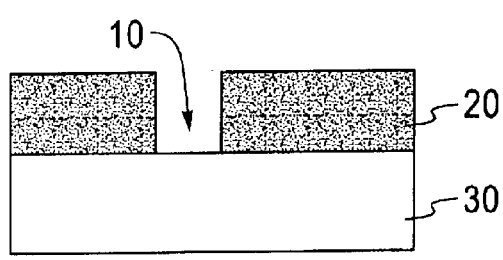
FIGS. 1A–1C show a cross section view of a first prior art method for forming air gaps.
Figure 1B:
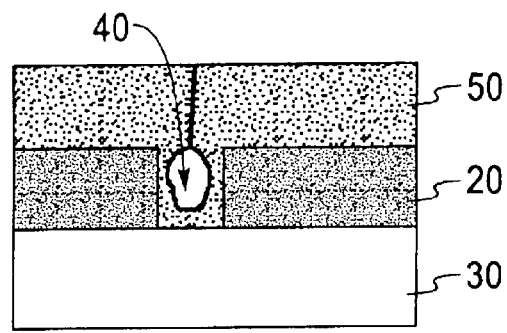
Figure 1C:
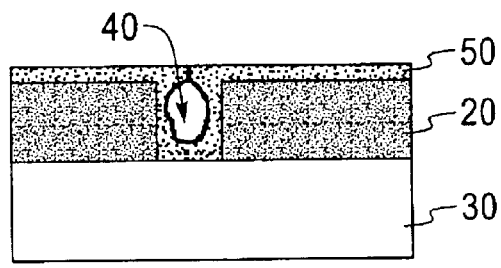
Figure 2A:
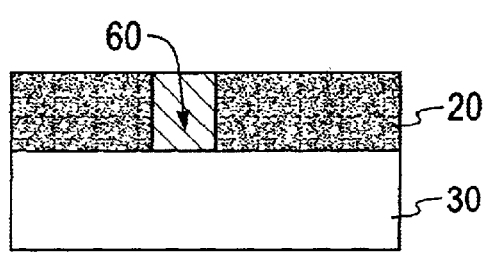
FIGS. 2A–2C show a cross section view of a second prior art method for forming air gaps.
Figure 2B:
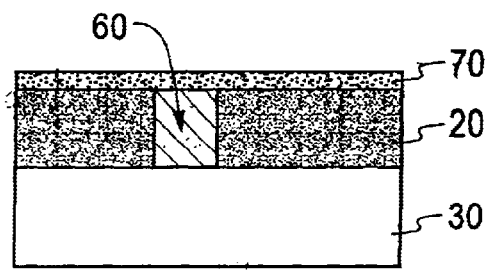
Figure 2C:
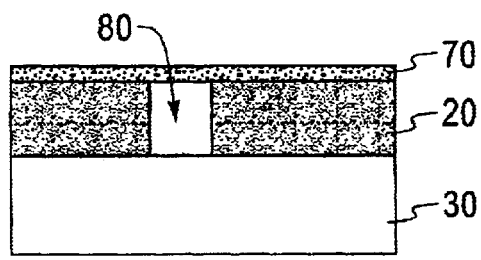
Figure 3A:
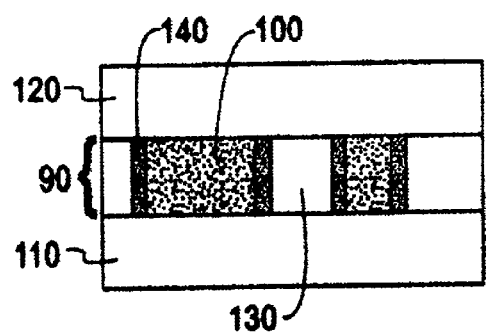
FIGS. 3A–3D show a cross section view of embodiments of the air-gap-containing wiring level structures of the present invention.

FIGS. 3A–3D show examples of the air-gap-containing wiring levels of the present invention, in cross section view. Air-gap-containing wiring levels 90 with conductive wiring patterns 100 are shown sandwiched between a substrate 110 below and a via level dielectric 120 above. As will be discussed below, some or all of via level dielectric 120 would have comprised the bridge layer used to define the top surface of the air gaps at the point in the process when the air gaps were first formed. FIG. 3A shows the line level dielectric as a composite dielectric comprising air gaps 130, bounded on vertical surfaces by dielectric sidewall spacers 140, and bounded on horizontal surfaces by substrate underlayer 110 and via level dielectric overlayer 120.

Dielectric sidewall spacers 140 serve several key functions. First, they provide a mechanical constraint on the conductor against electromigration-driven mass transport of conductive material such as Cu out of the wiring structures. This helps prevent openings caused by the diffusion of wiring material out of the original wiring to leave a cavity, and shorts caused by the build up of wiring material outside the original wiring to form a protrusion. In addition, the dielectric sidewall spacers 140 can protect the wiring from exposure to gaseous environmental contaminants in the air gap (such as oxygen), and block possible migration pathways for atoms of wiring material which might otherwise find their way to the transistors in the semiconductor substrate (not shown) in or below substrate 110.

Figure 3B:
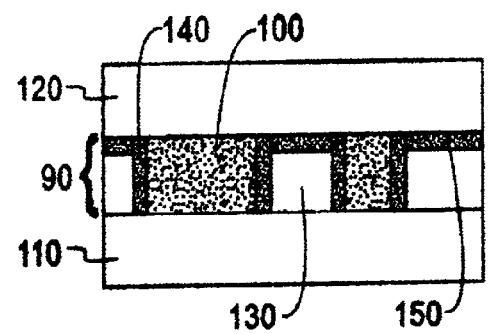
Figure 3C:
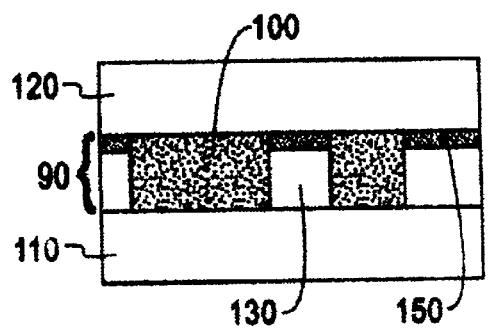
Figure 3D:
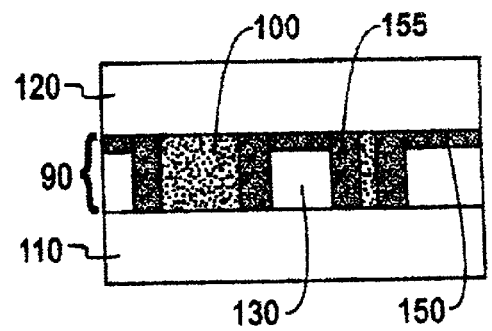

FIG. 3B shows the air-gap-containing line level dielectric as a composite dielectric comprising air gaps 130 capped by a thin, patterned dielectric layer 150 whose lateral dimensions match those of the air gap. Dielectric layer 150 may be formed from a hard mask material left in the structure after being used to define the air gap dimensions. FIG. 3C shows the composite air-gap-containing line level dielectric 90 of FIG. 3B with optional dielectric capping layer 150 and air gaps 130 bounded on their vertical surfaces by the conductive wiring material 100 instead of sidewall spacers 140. An improved version of the no-dielectric sidewall spacer case of FIG. 3C is shown in FIG. 3D where the wiring pattern includes conductive sidewall spacers 155 to help confine the conductive wiring materials. Conductive sidewall spacers 155 are preferably much less susceptible to electromigration than conductive wiring material 100.

Conductive wiring material 100 and conductive sidewall spacers 155 may be formed from various combinations of conductive adhesion layers, diffusion barriers, and high-conductivity metals. Preferred components of the conductive wiring material may be barrier and adhesion layers such as doped semiconductors, metal nitrides, conductive metal oxides, metal silicon nitrides, metal silicides, and metals; and alloys, mixtures and multilayers of the aforementioned materials. Preferred conductive materials include W, Cu, Au, Ag, Ta, Ni, Co, NiP, CoP, Cr, Pd, TaN, TiN, TaSiN, TiAlN, Al, and Al-Cu.

These conductive materials may be formed by various methods well known to those skilled in the art, including but not limited to: spinning from solution, spraying from solution, chemical vapor deposition (CVD), plasma enhanced CVD (PECVD), sputter deposition, reactive sputter deposition, ion beam deposition, electroless or electrolytic plating, and evaporation.

Figure 4A:
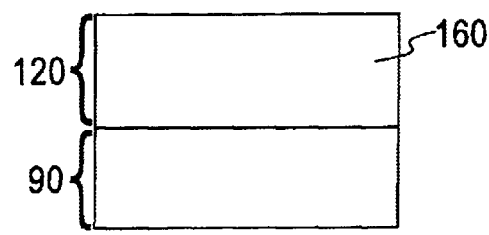
FIGS. 4A–4F show a cross section view of embodiments of via level dielectrics of the invention that may be formed above the line level dielectric geometries of FIGS. 3A–3D.
Figure 4B:
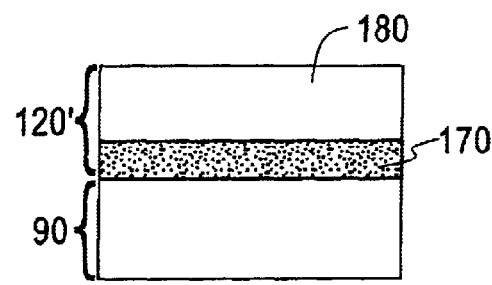
Figure 4C:
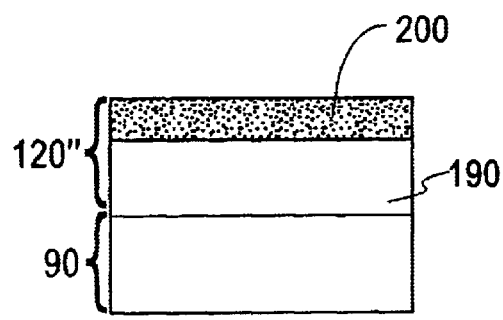
Figure 4D:
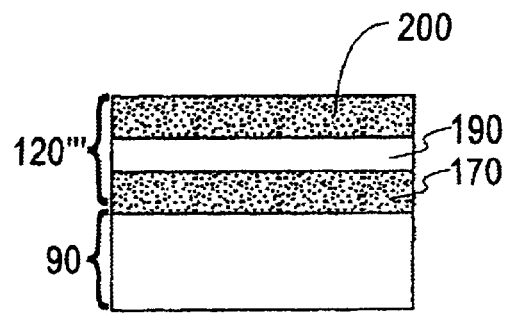
Figure 4E:
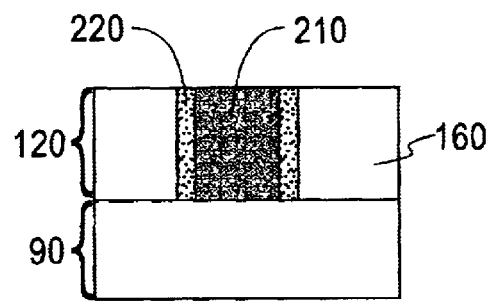
Figure 4F:
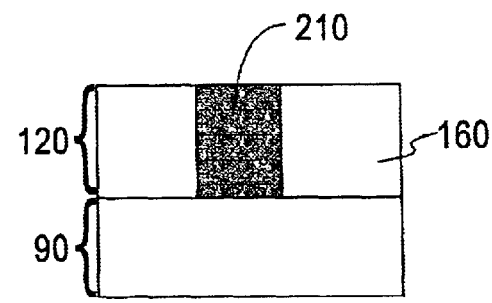

FIGS. 4A–4F show possible structures for the via level dielectric 120 shown in FIGS. 3A–3D. FIG. 4A shows via level dielectric 120 as a solid, single component dielectric 160. FIG. 4B shows via level dielectric 120' as a two-component stack comprising a thin lower layer dielectric 170 in the range from about 5 Å to about 1000 Å and an upper thicker dielectric layer 180 in the range from about 1000 Å to about 2 μm. Lower layer 170 might be a material selected for its diffusion barrier or adhesion properties, whereas upper layer 180 might be a material selected for its low k value. FIG. 4C shows via level dielectric 120" as a different two-component stack comprising a thicker lower layer 190 in the range from 1000 Å to 2 μm and a thinner upper layer 200 in the range from 5 Å to 1000 Å. Upper layer 200 might be one or more thin dielectric layers selected for their etch stop or hard mask properties, whereas lower layer 190 might be a material selected for its low k value. FIG. 4D shows via level dielectric 120''' as a three-component stack comprising 3 layers 170, 190, and 200 having any of the properties described above. Conductive vias 210 may be formed in any of the via level dielectric stacks of FIGS. 4A–4D. FIG. 4E shows vias 210 within dielectric sidewall spacers 220 for the case of the via level dielectric structure of FIG. 4A. More preferably conductive vias would be formed without dielectric sidewall spacers, as shown for the FIG. 4A case in FIG. 4F.

The various solid dielectrics in the via and line levels may be single or multiphase dielectric materials selected from the group consisting of silicon-containing materials such as amorphous hydrogenated silicon (a-Si:H, $SiO_2$, $Si_3N_4$, $SiOxN_y$, SiC, SiCO, SiCOH, and SiCH compounds, these silicon-containing materials with some or all of the Si replaced by Ge, inorganic oxides, inorganic polymers, organic polymers such as polyimides, other carbon-containing materials, organo-inorganic materials such as spin-on glasses, diamond-like carbon (DLC, also known as amorphous hydrogenated carbon, a-C:H) with or without one or more additives selected from the group containing F, N, O, Si, Ge, metals, and nonmetals. For a description of diamond-like carbon (DLC), reference is made to U.S. Pat. No. 5,559,367 which issued Sep. 24, 1996 to Cohen et al. which is incorporated herein by reference. For a description of SiCOH compounds reference is made to U.S. Ser. No. 09/107567 filed Jun. 29, 1998 by A. Grill et al. entitled "Hydrogenated Oxidized Silicon Carbon Material", now U.S. Pat. No. 6,147,009, which is incorporated herein by reference. For a description of a multiphase low dielectric constant material for use as an intralevel or interlevel dielectric film, a cap material, or a hard mask/polish stop in a wiring structure, reference is made to U.S. Ser. No. 09/320495 filed May 26, 1999, now U.S. Pat. No. 6,312,793, by S. M. Gates et al. entitled "Multiphase Low Dielectric Constant Material and Method of Deposition" which is incorporated herein by reference. Additional choices for one or more of the solid via and line level dielectrics include any of the aforementioned materials in porous forms, or in a from that changes during processing from porous and/or permeable to non-porous and/or non-permeable.

These dielectrics may be formed by various methods well known to those skilled in the art, including but not limited to: spinning from solution, spraying from solution, chemical vapor deposition (CVD), plasma enhanced CVD (PECVD), sputter deposition, reactive sputter deposition, ion-beam deposition, and evaporation.

Figure 5:
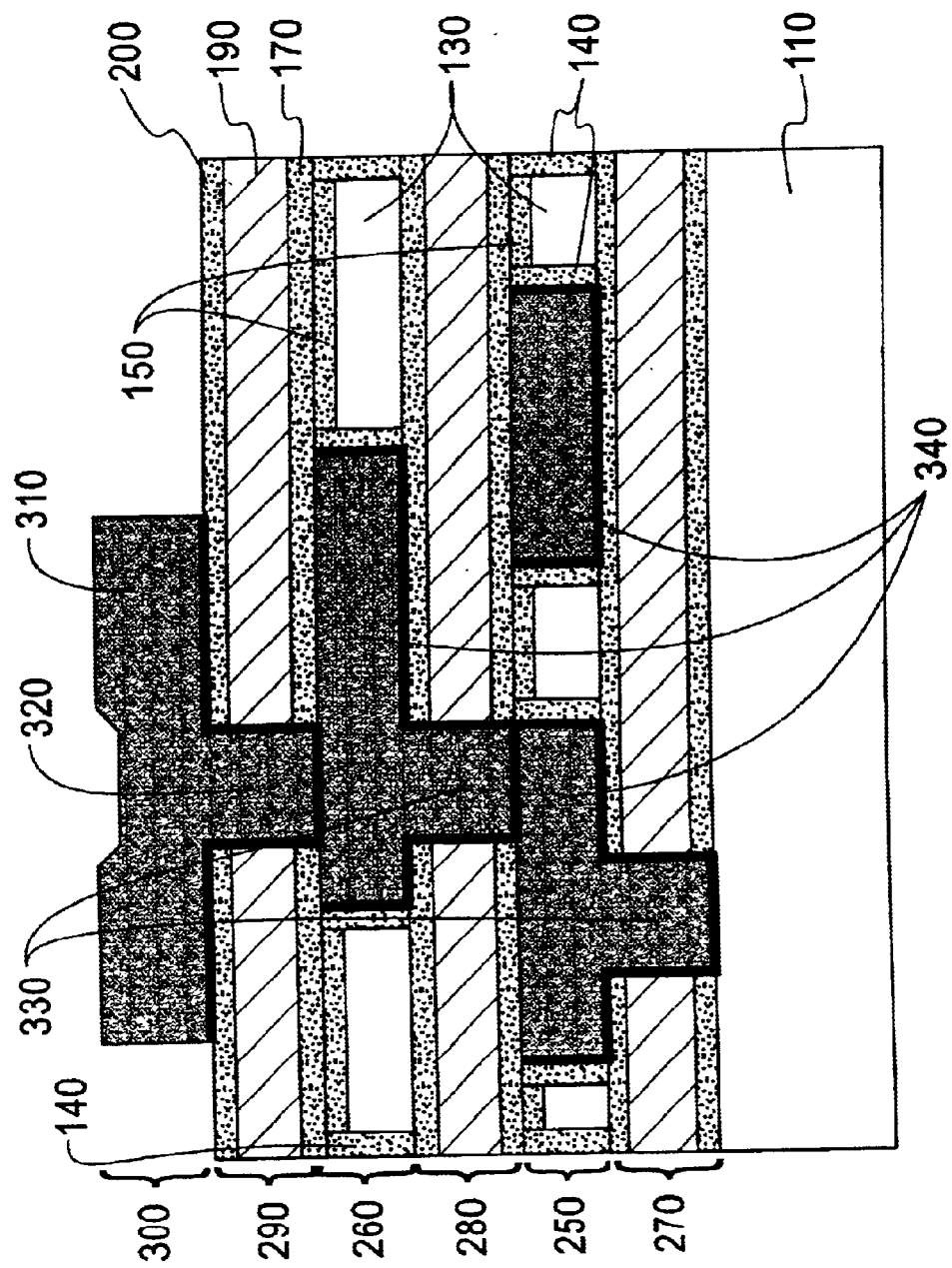
FIG. 5 shows a cross section view of a multilevel interconnect structure of the present invention.

FIG. 5 shows a multilevel interconnect structure of the present invention, in cross section view. A key design feature of this structure is that a permanent, solid low-k dielectric is used for the via levels, while a composite solid plus air-gap-containing dielectric is used for the wiring levels. The air gaps 130 are thus located where the need for the low-k dielectric is most critical due the close spacing between lines in the same wiring level. Solid dielectrics in the via level provide structural rigidity and are located in the part of the structure where the need for low k is not as critical.

The structure of FIG. 5 comprises substrate 110, two air-gap containing wiring levels 250 and 260, three via levels 270, 280 and 290, and a final pad level 300 with conductive pad 310 connected by an underlying via 320 to the uppermost line level 260. The via levels 270 and 280 comprise conductive vias 330 embedded in one or more solid via level dielectrics. In the particular example of FIG. 5, the one or more solid via level dielectrics comprise layers 170, 190, and 200. Wiring levels 250 and 260 comprise conductive wiring features 340 embedded in composite dielectrics containing air gaps 130. The air gaps of the composite dielectric are bounded on side surfaces by dielectric sidewall spacers 140 of a solid sidewall spacer material and bounded on top surfaces by the an overlying bridge layer of one or more solid dielectrics which may comprise the optional patterned dielectric 150 shown in FIG. 5 and shown previously in FIGS. 3B–3D and/or function as the next level's via dielectrics e.g., dielectrics 170, 190 and/or 200.

It should be noted that the multilevel interconnect structures of the present invention contain at least one air-gap-containing wiring level. All the wiring levels may contain air gaps, or some wiring levels may contain air gaps while others do not.

Figure 6A:
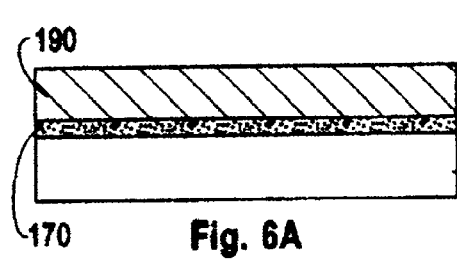

FIGS. 6A–6F show a cross section view illustrating the steps of a method for forming a structure of the present invention. First, the one or more dielectric layers comprising via level dielectric 270 are formed on substrate 110, as shown in FIG. 6A. Via level dielectric 270 is shown as including two dielectric layers 170 and 190, but it may have as few as one or as many as ten layers. The dielectric layers of 270 may be deposited in a single integrated process step, in one or more closely spaced sequential steps, or in such a manner that significant processing takes place when some but not all of layers dielectric 270 layers are completely in place. For example, one or more of the lower layers of dielectric 270 may have been thinned before deposition of the upper layers of dielectric 270, or one or more of the lower layers of dielectric 270 may have been left over from previous process steps and incorporated into dielectric 270 for convenience.

Figure 6B:
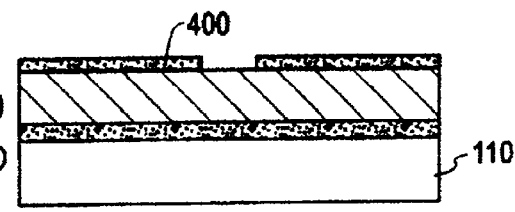
Figure 6C:
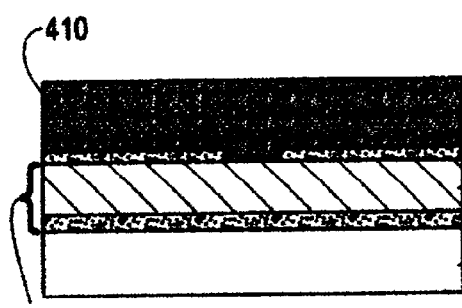
Figure 6D:
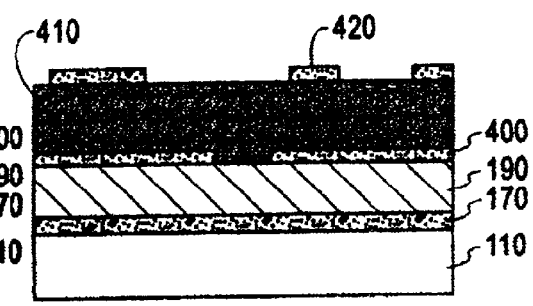

A via-patterned dielectric hard mask layer 400 is then formed and patterned on the top of the via level dielectric as shown in FIG. 6B. A layer of sacrificial material 410 is then formed on via-patterned patterned hard mask 400 and via level dielectric 190 to form the structure shown in FIG. 6C. A line-patterned hard mask 420 for the conductive wiring is then formed on sacrificial material 410 as shown in FIG. 6D. Line-patterned hard mask 420 may comprise one or more layers of one or more materials, for example, it may comprise a nitride/oxide bilayer with a thin $SiN_x$ layer below a thicker $SiO_2$ layer, or any of a variety of carbon-based materials also containing silicon. These exemplary mask materials would preferably be deposited at relatively low temperature, for example, below 200° C. so as not to damage sacrificial layer 410. The line pattern of mask 420 is then transferred into sacrificial material 410 to form line-shaped cavities 430 shown in FIG. 6E. Hard mask 420 may optionally be removed at this point if it is not desired as a component of the composite line level dielectric.

Figure 6E:
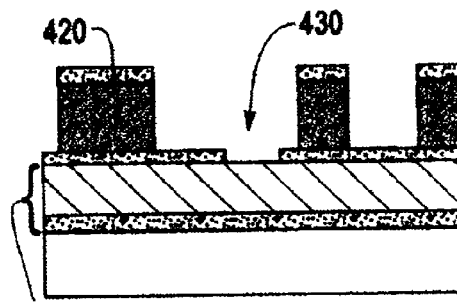
Figure 6F:
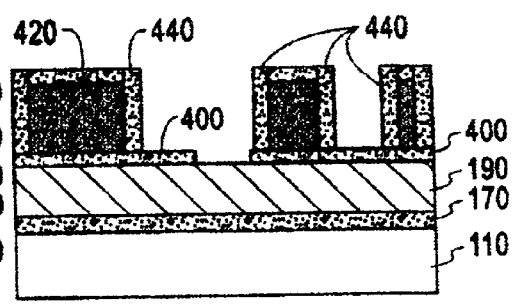
Figure 6G:
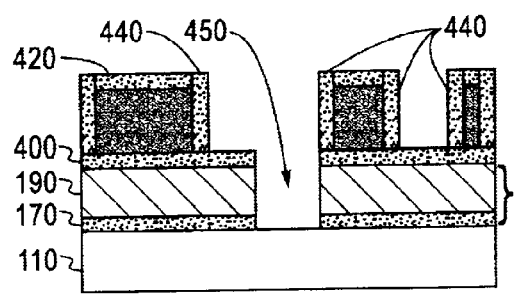

A thin conformal layer of a dielectric sidewall spacer material is then deposited into line-shaped cavity 430 and etched anisotropically to form sidewall spacers 440 as shown in FIG. 6F. Following this, the one or more via level dielectrics as shown in FIGS. 6A–6F as 170 and 190 are patterned with via-patterned mask 400 to form cavities 450 shown in FIG. 6G. Hard mask 420 may optionally be removed at this point if it still remains in the structure and is not desired as a component of the composite line level dielectric.

Via level dielectric 270 may preferably include a protective blanket dielectric layer (not shown) between via dielectric 190 and via-patterned mask 400 to protect via level dielectric 270 from the etching steps required to pattern sacrificial material 410 as shown in FIG. 6E, and from the etching and deposition steps required to form the sidewall spacers 440 as shown in FIG. 6F. A preferred combination of materials might be $SiO_2$ for the via-patterned hard mask 400, $SiN_x$ for the protective dielectric underlayer (not shown), and an organic dielectric for dielectric 190. In a preferred combination of $SiN_x$ and $SiO_2$ thicknesses, the $SiN_x$ would be two to three times thinner than the $SiO_2$.

Figure 6H:
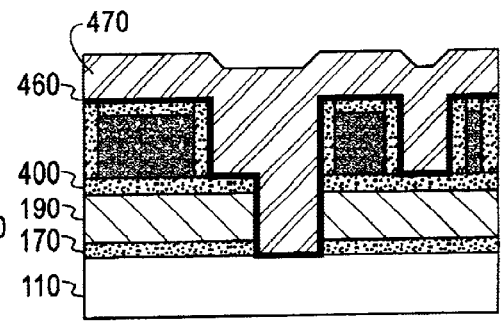
Figure 6J:
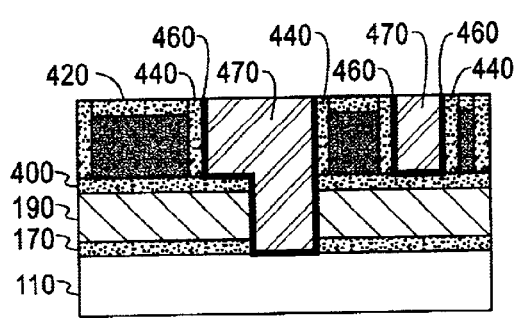
Figure 6J:
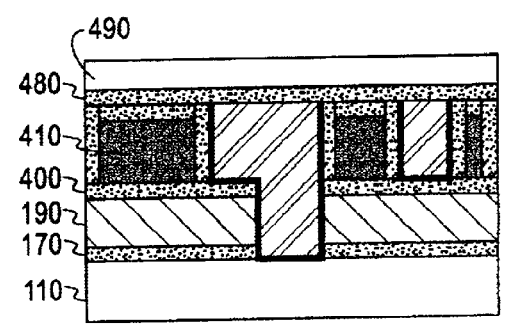

Next a thin conformal layer 460 of one or more conductive wiring materials is deposited into the via level cavity 450 and line level cavity 430. Cavities 450 and 430 are then overfilled with additional conductive wiring material 470, which may be the same or different from conductive wiring material 460, to form the structure shown in FIG. 6H. The overfill is then removed by a process such as chemical mechanical polishing to leave the planar structure of FIG. 6I. At this point, one or more layers are formed on the planarized wiring structure to form a bridge layer, shown as 480 and 490 in FIG. 6J. It should be noted that the bottom-most portion of the first of these layers (480) must be insulating, as it will remain in the structure as part of the via level dielectric for the next via level.

Figure 6K:
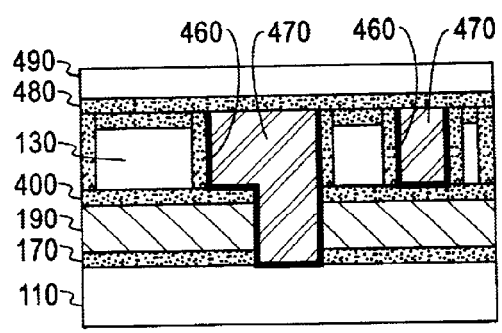
Figure 6L:
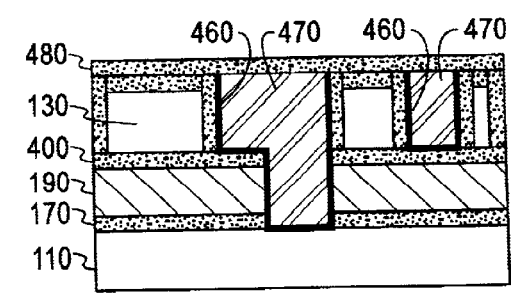

The sacrificial material 410 is then removed to form air gaps 130 as shown in FIG. 6K. Removal may be by one or more methods selected from the group consisting of thermal decomposition; thermal or non-thermal processes incorporating reactive chemical agents (e.g., $O_2$), reactive plasma, and/or absorption of energetic electromagnetic radiation e.g., microwaves, ultraviolet light, a laser at a selected wavelength. Finally, those portions of the bridge layer not needed for the next level's via level dielectric are removed to form the structure of FIG. 6L. The processing is then repeated for as many air gap wiring levels as desired.

An advantage of the processing described in FIGS. 6A–6L is that it provides a dual (as opposed to single) damascene method to make an air-gap-containing interconnect structure. Both the vias and the lines are filled with conductive material during the same filling step, and planarization of a paired via and line level is achieved with a single polishing step instead of the two that would be required if the filling and polishing were done a single level at a time.

An alternative method to the steps illustrated in FIGS. 6A–6K comprises via-patterning hard mask layer 400 after formation of cavities 430 shown in FIG. 6E. However this exposes sacrificial material 410 to such potentially damaging process steps such as photoresist application and development. In addition, via-pattern lithography over the topography of the line-patterned cavities is more challenging since the resist thicknesses are less uniform.

Figure 7:
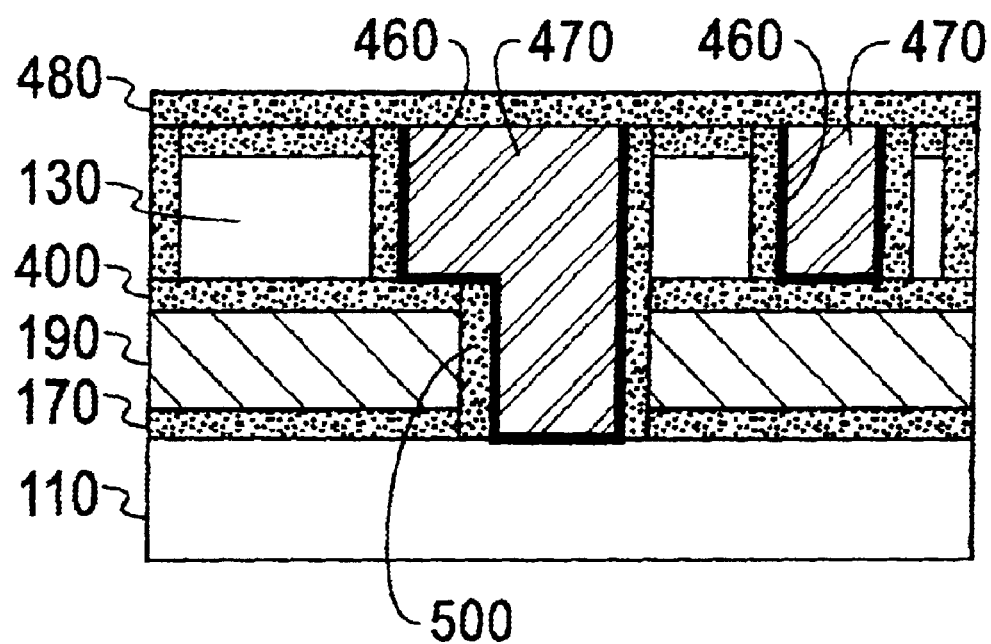
FIG. 7 shows a cross section view illustrating an alternate method and embodiment of the present invention.

An alternative dual damascene method may also be used. In this method, line-patterned hard mask layer 420 shown in FIG. 6D is replaced by a dual pattern hard mask comprising both the via and line level patterns, and the buried via-patterned hard mask layer 400 is omitted. The dual pattern hard mask may be formed by various methods known in the art; for example, the dual pattern hard mask could be a single layer hard mask that is patterned twice—first with a via pattern and en with a line pattern. Alternatively, the dual pattern hard mask may be a hard ask comprising two or more layers, as described in U.S. Ser. No. 09/126212, filed Jul. 30, 1998, now U.S. Pat. No. 6,140,226, by A Grill et al. entitled "Dual Damascene Processing for Semiconductor Chip Interconnects" which claims priority of U.S. provisional application Serial No. 60/071,628 filed Jan. 16, 1998 which is incorporated herein by reference. However, the omission of hard mask 400 makes it difficult to form line level cavity 430 without at the same time forming the underlying via level cavity 450. Consequently, the step of forming sidewall spacers 440 will also leave sidewall spacer material inside via hole 450, decreasing the volume available for the conductive material. This embodiment is illustrated in FIG. 7 which shows the structure of FIG. 6L with the additional sidewall spacers 500 in former via hole 450.

While the previously described methods of this invention may be used to build multilayer wiring structures by repeating the various process steps as many times as needed, it should be noted that some or all of the steps of sacrificial material removal may be combined into a single step of sacrificial material removal performed after two or more completed line level layers are in place. With this approach, chemical mechanical polishing (CMP) can be done to planarize an upper level of wiring without jeopardizing the potentially fragile air gaps in the lower wiring levels.

It should also be noted that the methods and structures of this invention allow for the dielectric sidewall spacers 440 and/or 500 to be replaced with sidewall spacers of a conductive material.

If removal of sacrificial material 410 is by thermal decomposition, the sacrificial material would preferably be thermally stable below a first temperature, and thermally unstable above a second temperature higher than the first temperature. Processing such as film deposition and patterning would typically be performed below this first temperature, which might be in the range from 60 to 200° C. Note that if the temperature of sacrificial material deposition is substantially below this first temperature, anneals at temperatures at or slightly above this first temperature ma be performed to insure that the sacrificial material has sufficient compositional and dimensional stability for process steps at or below this first temperature. For additional information with regard to dimensional and/or thermal stability of carbon based amorphous materials, reference is made to U.S. Ser. No. 08/916,011, filed Aug. 21, 1997, now U.S. Pat. No. 6,030,904, by A. Grill et al. entitled "Stabilization of Low-K Carbon Based Dielectrics" which is incorporated herein by reference. The sacrificial material would typically be removed by a process such a thermal decomposition at one or more temperatures above the second temperature, which might be in the range from 200 to 425° C. Thermal decomposition above the second temperature would preferably produce easily dispersed volatiles and leave little residue. The sacrificial materials may be formed by various methods well known to those skilled in the art, including but not limited to: spinning from solution, spraying from solution, chemical vapor deposition (CVD), plasma enhanced CVD (PECVD), sputter-deposition, ion-beam deposition and evaporation.

The sacrificial material from which the air gap is formed may be selected from the group comprising single or multiphase organic or inorganic materials that may be crystalline, amorphous or polymeric. Preferred sacrificial materials include decomposable polymers such as norbornene derivatives manufactured by BF Goodrich, Cleveland Ohio. for example, a copolymer of butylnorbornene and triethoxysilyl norbornene sold as Unity Sacrificial Polymer™; polymethylmethacrylate, polystyrene, polycaprolactone, polyacrylamide their copolymers and derivatives; and low thermal stability versions of amorphous materials such as diamond-like-carbon (DLC) (also known as amorphous hydrogenated carbon or a-C:H). The sacrificial material may also be low thermal stability versions of a C:H or amorphous fluorinated carbon (a-C:F) with additives selected from the group consisting of O, N, Si, F, Ge, metals, and nonmetals, or any of the aforementioned materials in porous form The sacrificial material may be water soluble such as $GeO_2$.

A particularly preferred sacrificial material is the Unity Sacrificial Polymer™. Other particularly preferred sacrificial materials are low thermal stability (LTS) versions of DLC, for example a-C:H materials which lose greater than 50% of their mass at annealing temperatures of 400° C. or below. In common with their more stable DLC relatives, LTS DLC can be grown by PECVD from any gaseous hydrocarbon precursor such as $C_2H_4$ and $C_6H_{12}$. Film growth generally reflects the outcome of two competing plasma processes: film deposition (from the accumulation of reactive $C_xH_y$ radicals on the growth surface) and film etching (primarily mediated by ion bombardment which sputters away the less tightly bound components of the growing film).

Stable DLC films are generally produced with "ion-growth"-controlled PECVD conditions to maximize film thermal stability and hardness, while lower stability films tend to be produced with "radical-growth"-controlled PECVD conditions. The decomposition characteristics of LTS DLC films can be tuned over a wide continuum by varying substrate temperature, bias voltage, plasma power, total pressure, and precursor type. A preferred version of LTS DLC was produced in a parallel plate reactor with conditions comprising a substrate temperature of 60° C., a precursor of $C_6H_{12}$ (cyclohexane) at a flow of 30 sccm, a pressure of 1000 mTorr, a −25 Vdc bias, and an RF power density of 0.4 W/cm$^2$ (~150W). In contrast, standard DLC films might be produced with a −200 to −250 Vdc bias and a pressure of 100 mTorr. LTS-type DLC films are also expected for bias voltages up to −100V, substrate temperatures between 25 and 200° C., flows between 5 and 200 sccm, and pressures between 200 and 2000 mTorr.

The one or more layers of the bridge layer structure, shown as 480 and 490 in FIG. 6K, are preferably dielectric single or multiphase, and selected from the group consisting of silicon-containing materials such as amorphous hydrogenated silicon (a-Si:H), $SiO_2$, $Si_3N_4$, $SiO_xN_y$, SiC, SiCO, SiCOH, and SiCH compounds, these silicon-containing materials with some or all of the Si replaced by Ge, inorganic oxides, inorganic polymers, organic polymers such as polyimides, other carbon-containing materials, organo-inorganic materials such as spin-on glasses, diamond-like carbon (DLC, also known as amorphous hydrogenated carbon, a-C:H) with or without one or more additives selected from the group consisting of F, N, O, Si, Ge, metals and nonmetals. Additional choices for one or more of the bridge layer dielectrics include any of the aforementioned materials in porous form, as well as materials that may change during processing to or from porous and/or permeable forms. Treatments that may effect changes in film porosity/permeability include thermal annealing and/or irradiation by electromagnetic radiation such as ultraviolet light.

It should be noted that the method of the present invention further includes the steps of selecting the conductive materials for the vias and wiring from the groups of possible conductive wiring and via materials described above, and the steps of selecting the solid permanent dielectric materials and masks from the group of materials described above. In addition, any of the above conductive materials may also be used as hard mask materials and or the upper layers of a multilayer bridge layer structure, although these materials would normally not remain in the final structure.

While a method and interconnect wiring structure has been described incorporating airgaps, cavities or voids to reduce interwiring capacitance, it should be understood that the terminology used is intended to be in a nature of words of description rather than of limitation. Furthermore, while the present invention has been described in terms of several preferred embodiments, it is to be appreciated that those skilled in the art will readily apply these teachings to other possible variations of the inventions.

Having thus described our invention, what we claim as new and desire to secure by Letters Patent is:

1. A method for forming an interconnect structure comprising a lower via level and an upper line level, comprising the steps of:

forming a via level dielectric layer on a substrate, said via level dielectric layer including one or more dielectric materials, forming a layer of sacrificial material on said via level dielectric layer, patterning said sacrificial material to form slightly oversized wiring-shaped cavities for line level wiring structures, said patterning including a step of stopping at a first via level dielectric layer, forming a thin conformal layer of a sidewall spacer dielectric in said wiring-shaped cavities previously formed in said step of patterning, etching said thin conformal layer sidewall spacer dielectric to form sidewall spacers on said sacrificial material, patterning said via level dielectric with via-shaped cavities for via structures, forming a thin conformal layer of a conductive liner material to provide a diffusion barrier, adhesion layer, and/or seed layer;

overfilling said via-shaped and wiring-shaped cavities with a conductive material, removing said overfill of conductive material by chemical mechanical polishing, leaving a planar structure, forming one or more layers on said planar structure to form a bridge structure, the bottom-most layer of said bridge structure being dielectric, at least bottom-most portion of said bottom-most dielectric layer remaining in the bridge structure as part of the via level dielectric for the next via level, removing said sacrificial material, and removing upper portions of said bridge layer whereby said removed upper portions are not in the final structure.

2. The method of claim 1 repeated one or more times for making a multilevel interconnect structure containing two or more air-gap containing line levels.

3. The method of claim 2 modified so that some or all of said steps of removing said sacrificial material are combined into a single step of sacrificial material removal performed after two or more line level layers are completely in place.

4. The method of claim 1 wherein said step of removing said sacrificial material is performed by one or more methods selected from the group consisting of thermal decomposition; thermal or non-thermal processes incorporating reactive chemical agents, reactive plasma, and/or absorption of energetic electromagnetic radiation wherein said radiation is selected from the group consisting of microwaves and ultraviolet light.

5. The method of claim 1 further including the step of forming a permanent dielectric hard mask as the top layer of said via level dielectric and via-patterning said mask layer prior to the step of depositing raid sacrificial material.

6. The method of claim 1 modified so that both line and via cavities are formed prior to sidewall spacer formation, and sidewall spacers are formed on the sidewalls of both the line level cavities and the via level cavities.

7. The method of claim 1 further including the step of selecting one or more conductive wiring and via materials from the group comprising W, Cu, Au, Ag, Ta, Ni, Co, NiP, CoP, Cr, Pd, TaN, TiN, TaSiN, TiAlN, AI, AI-Cu, doped semiconductors; other metal nitrides, conductive metal oxides, other metal silicon nitrides, metal suicides, and other metals; alloys, mixtures and multilayers of said aforementioned materials.

8. The method of claim 1 further including the step of selecting one or more solid dielectrics for said via and line levels, said solid dielectric material being single or multiphase and selected from the group consisting of silicon-containing materials such as amorphous hydrogenated silicon (a-Si:H), SiO2, $SiN_4$, SiOxNy, SiC, SiCa, SiCOH, and SiCH compounds; these silicon-containing materials with some or all of the Si replaced by Ge; inorganic oxide, inorganic polymers; organic polymers ;organo-inorganic materials diamond-like carbon with or without one or more additives selected from the group containing F, N, O, Si, Ge, metals and nonmetals; the aforementioned dielectrics in porous form, or in a form that that may change during processing to or from a porous and/or permeable form.

9. The method of claim 1 further including the step of selecting said one or more layers of said bridge structure of a single or multiphase material selected from the group consisting of amorphous hydrogenated silicon (a-Si:H), SiO2, $SiN_4$, SiOxNy, SiC, SiCa, SiCOH, and SiCH compounds; these silicon-containing materials with some or all of the Si replaced by Ge; inorganic oxides, inorganic polymers; organic polymers ; organo-inorganic materials diamond-like carbon with or without one or more additives selected from the group containing F, N, O, Si, Ge, metals and nonmetals; the aforementioned dielectrics in porous form, or in a form that may change during processing to or from a porous and/or permeable form.

10. The method of claim 1 wherein said step of forming a layer of sacrificial material includes selecting a single or multiphase sacrificial material from the group consisting of organic or inorganic polymers, and amorphous carbon-containing materials; low thermal stability versions of amorphous materials with or without additives selected from the group containing O, N, Si, F, Ge, metals, nonmetals.

11. The method of claim 10 wherein said step of forming said layer of sacrificial material includes the steps of:

placing a substrate in a plasma enhanced chemical vapor deposition chamber, flowing a hydrocarbon-containing precursor gas into said chamber, establishing a plasma in said chemical vapor deposition chamber to initiate film growth, and continuing said plasma until forming a desired layer thickness on said substrate.

12. The method of claim 11 further including the steps of:

selecting a chemical vapor deposition chamber having a parallel plate geometry, heating said substrate to a temperature between about 25° C. and 2000° C., flowing a hydrocarbon gas comprising cyclohexane ($CJII2$) at a flow rate between 5 sccm and 200 sccm, adjusting pressure of said hydrocarbon gas to a value between about 200 and about 2000 mTorr, and establishing a substrate dc bias between about −25 V dc and about −100 V dc whereby a low thermal stability diamond-like carbon layer is formed.

13. A method for forming an interconnect structure comprising a lower via level and an upper line level, comprising the steps of:

forming a via level dielectric layer on a substrate, said via level dielectric layer including one or more dielectric materials, forming a layer of sacrificial material on said via level dielectric layer, patterning said sacrificial material to form slightly oversized wiring-shaped cavities for line level wiring structures, said patterning including a step of stopping at a first via level dielectric layer, patterning said via level dielectric with via-shaped cavities for via structures, forming sidewall spacers in both said via-shaped and wiring shaped cavities, forming a thin conformal layer of a conductive liner material to provide a diffusion barrier, adhesion layer, and/or seed layer, overfilling said via-shaped and wiring-shaped cavities with a conductive material, removing said overfill of conductive material by chemical mechanical polishing, leaving a planar structure, forming one or more layers on said planar structure to form a bridge structure, the bottom-most layer of said bridge structure bring dielectric, at least bottom-most portion of said bottom-most dielectric layer remaining in the bridge structure as part of the via level dielectric for the next via level, and removing said sacrificial material.

* * * * *